(12) United States Patent
Sampath

(10) Patent No.: US 7,331,026 B2
(45) Date of Patent: Feb. 12, 2008

(54) METHOD AND SYSTEM FOR GENERATING AN INITIAL LAYOUT OF AN INTEGRATED CIRCUIT

(75) Inventor: Hemanth Sampath, Pittsburgh, PA (US)

(73) Assignee: Cadence Design Systems, Inc., San Jose, CA (US)

( * ) Notice: Subject to any disclaimer, the term of this patent is extended or adjusted under 35 U.S.C. 154(b) by 290 days.

(21) Appl. No.: 10/964,503

(22) Filed: Oct. 12, 2004

(65) Prior Publication Data

US 2006/0080629 A1    Apr. 13, 2006

(51) Int. Cl.
    *G06F 17/50* (2006.01)
(52) U.S. Cl. .............. 716/9; 716/10; 716/13; 716/14; 716/3; 716/18
(58) Field of Classification Search .......... 716/9, 716/10, 13, 14, 3, 18
    See application file for complete search history.

(56) References Cited

U.S. PATENT DOCUMENTS

| | | | | |
|---|---|---|---|---|
| 5,798,935 | A * | 8/1998 | Doreswamy et al. | 716/6 |
| 6,189,132 | B1 * | 2/2001 | Heng et al. | 716/11 |
| 6,446,239 | B1 * | 9/2002 | Markosian et al. | 716/2 |
| 6,449,761 | B1 * | 9/2002 | Greidinger et al. | 716/11 |
| 6,904,571 | B1 * | 6/2005 | Schmidt et al. | 716/2 |
| 7,003,749 | B2 * | 2/2006 | Subasic et al. | 716/10 |
| 2005/0155006 | A1 * | 7/2005 | Subasic et al. | 716/10 |

OTHER PUBLICATIONS

Rijmenants et al., "ILAC: An Automated Layout Tool for Analog CMOS Circuits", IEEE Journal of Solid-State Circuits, vol. 24, No. 2, Apr. 1999, pp. 417-425.*
Costa et al., "Symbolic Generation of Constrained Random Logic Cells", IEEE Transactions on Computer-Aided Design of Integrated Circuits and Systems, vol. 10, No. 2, Feb. 1991, pp. 220-231.*
Cadence Design Systems, Inc. (Jul. 2004). "Virtuoso® XL Layout Editor User Guide, Product Version 5.0," pp. 1-23. (Table of Contents Only).
Cadence Design Systems, Inc. (May 2004). "NeoCell® User's Guide, Product Version 3.4," cover page and pp. i-viii. (Table of Contents Only).

* cited by examiner

*Primary Examiner*—Phallaka Kik
(74) *Attorney, Agent, or Firm*—Morrison & Foerster LLP

(57) ABSTRACT

A system for generating a layout of an integrated circuit is disclosed. The system includes at least one processing unit for executing computer programs, a graphical-user-interface for viewing representations of the integrated circuit on a display and observing the layout of the integrated circuit, and a memory for storing databases of the integrated circuit. The system further includes means for retrieving locations of a plurality of devices from a schematic of the integrated circuit, means for retrieving user-specified placement constraints, and means for placing the devices in accordance with the locations and the user-specified placement constraints.

45 Claims, 4 Drawing Sheets

METHOD AND SYSTEM FOR GENERATING AN INITIAL LAYOUT OF AN INTEGRATED CIRCUIT

FIELD OF THE INVENTION

The present invention relates to the field of electronic design automation (EDA) tools. In particular, the present invention relates to a method and system for generating an initial layout of an integrated circuit.

BACKGROUND OF THE INVENTION

In designing an integrated circuit, one of the approaches is to perform interactive placement and routing of devices of the integrated circuit. With this design approach, it is desirable to efficiently generate an initial layout of the design so that designers can use that conduct interactive placement and routing of the integrated circuit. Existing EDA tools do not provide adequate support of this design methodology. Some EDA tools, such as the NeoCell AutoPlace from Cadence Design Systems, Inc., use an automatic placement approach to generate the initial layout, which typically takes a long time to run and does not provide a predictable and consistent initial layout. In addition, existing EDA tools do not take into account the locations of the devices in the schematic of the integrated circuit for generating initial layout and thus fail to produce a predictable and consistent initial layout. Furthermore, existing EDA tools do not support user-specified placement constraints for generating initial layout and thus produce initial layouts that do not satisfy users' design requirements.

Therefore, new methods and systems for generating an initial layout of an integrated circuit are needed for addressing the above issues regarding the existing EDA tools.

SUMMARY

A method and system for generating an initial layout of an integrated circuit are disclosed. In addition to meeting the design rules for manufacturing the integrated circuit, the method attempts to satisfy user-specified placement constraints and maintain the relative device locations in the schematic of the integrated circuit. The user-specified placement constraints include grouping, symmetry, compound device, and matching constraints.

In one embodiment, a method for generating a layout of an integrated circuit includes retrieving locations of a plurality of devices from a schematic of the integrated circuit, retrieving user-specified placement constraints, and placing the devices in accordance with the locations and the user-specified placement constraints.

In another embodiment, a system for generating a layout of an integrated circuit includes at least one processing unit for executing computer programs, a graphical-user-interface for viewing representations of the integrated circuit on a display and observing the layout of the integrated circuit, and a memory for storing databases of the integrated circuit. The system further includes means for retrieving locations of a plurality of devices from a schematic of the integrated circuit, means for retrieving user-specified placement constraints, and means for placing the devices in accordance with the locations and the user-specified placement constraints.

In yet another embodiment, a computer program product comprises a medium for storing programs for execution by one or more computer systems. The computer program product further comprises a layout generator module for generating a layout of an integrated circuit, where the layout generator module is used in conjunction with at least a microprocessor unit, a memory, and a user interface. In addition, the layout generator module includes one or more computer programs containing instructions for retrieving locations of a plurality of devices from a schematic of the integrated circuit, retrieving user-specified placement constraints, and placing the devices in accordance with the locations and the user-specified placement constraints.

BRIEF DESCRIPTION OF THE DRAWINGS

The aforementioned features and advantages of the invention as well as additional features and advantages thereof will be more clearly understood hereinafter as a result of detailed descriptions of embodiments of the invention when taken in conjunction with the following drawings.

DESCRIPTION OF EMBODIMENTS

Figure 1:
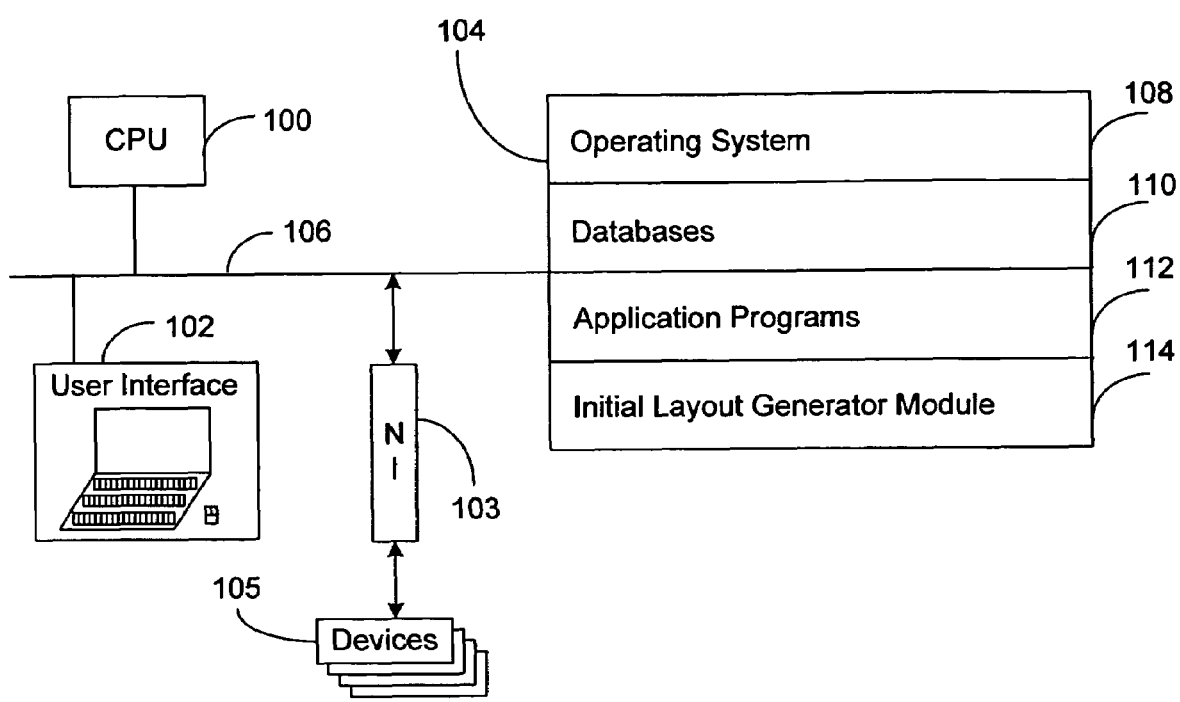
FIG. 1 illustrates an implementation of the initial layout generator using a computer system according to an embodiment of the present invention.

Methods and systems are provided for generating an initial layout of an integrated circuit. The following descriptions are presented to enable any person skilled in the art to make and use the invention. Descriptions of specific embodiments and applications are provided only as examples. Various modifications and combinations of the examples described herein will be readily apparent to those skilled in the art, and the general principles defined herein may be applied to other examples and applications without departing from the spirit and scope of the invention. Thus, the present invention is not intended to be limited to the examples described and shown, but is to be accorded the widest scope consistent with the principles and features disclosed herein.

An initial layout generator is an electronic design automation tool that generates an initial layout by taking into account design rules, as well as schematic locations and user-specified placement constraints of the integrated circuit. A schematic is a representation of a circuit, with various symbols representing devices and connections among the devices. Design rules consist of criteria such as spacing, width, and enclosure rules for the various layers that are used in a layout. If an integrated circuit contains design rule violations, it will not function correctly after it has been fabricated.

The user-specified placement constraints include the following categories:

Grouping constraint: A grouping constraint requires devices to be placed as close to each other as possible in a group. The group as a whole is considered as a single entity. All devices within the group are moved as a single entity. Devices inside a group can also be moved individually. The grouping constraint ensures that fabrication deviations are substantially the same among the devices within a group because of the close proximity of the devices.

There are two types of group forms supported by the initial layout generator, namely a free-form group and a grid-form group. In a free-form group, the layout generator determines the placement of the devices to obtain the optimal (minimum) group area. In a grid-form group, which is represented in the form of a two-dimensional grid, the user can interactively determine which devices can be placed in a particular grid.

Symmetry constraint: A symmetry constraint requires two or more devices to be placed symmetrically with respect to a symmetric line in the design. It ensures that fabrication deviations affect the devices in substantially the same manner. There are three kinds of symmetry constraints supported by the initial layout generator, namely mirror-symmetry, simple-symmetry, and self-symmetry constraints. The mirror-symmetry constraint requires that two or more devices be placed as a mirror reflection of each other with respect to a symmetric line. The simple-symmetry constraint requires that two or more devices be placed at the same distance from a symmetric line. The self-symmetry constraint is applied to an individual device. It requires that the geometric center of the device be placed along a symmetric line.

Compound constraint: A compound constraint requires two or more devices to be combined into a single compound device. A compound device moves as a whole, unlike a group where devices within a group can be moved individually.

Matching constraint: A matching constraint requires that two or more devices be placed close to each other so that the same orientation, style, proximity, and parameters may be applied to the devices.

In one embodiment, an initial layout generator is implemented using a computer system schematically shown in FIG. 1. The computer system includes one or more central processing units (CPUs) 100, at least a user interface 102, a memory device 104, a system bus 106, and one or more bus interfaces for connecting the CPU, user interface, memory device, and system bus together. The computer system also includes at least one network interface 103 for communicating with other devices 105 on a computer network. In alternative embodiments, much of the functionality of the circuit simulator may be implemented in one or more application-specific integrated circuits (ASICs) or field-programmable gate arrays (FPGAs), thereby either eliminating the need for a CPU, or reducing the role of the CPU in generating the initial layout of the integrated circuit.

The memory device 104 may include high-speed random-access memory and may also include non-volatile memory, such as one or more magnetic disk storage devices. The memory device 104 may also include mass storage that is remotely located from the CPU(s) 100. The memory device 104 preferably stores:

an operating system 108 that includes procedures for handling various basic system services and for performing hardware-dependent tasks;
databases 110 for storing information of the integrated circuit;
application programs 112 for performing other user-defined applications and tasks; and
an initial layout generator module 114 for generating an initial layout of an integrated circuit.

The database 110, the application programs 112, and the initial layout generator module 114 may include executable procedures, sub-modules, tables, and other data structures. In other embodiments, additional or different modules and data structures may be used, and some of the modules and/or data structures listed above may not be used.

Figure 2:
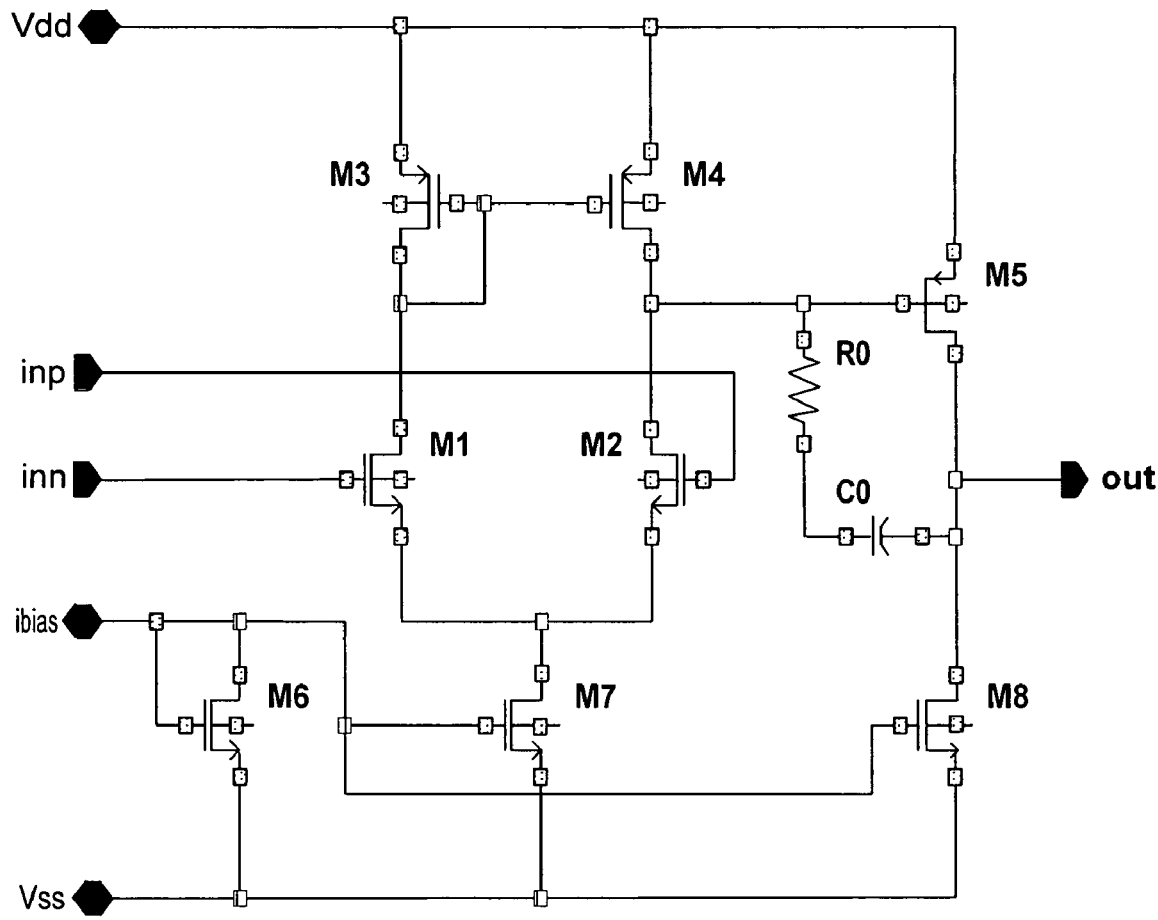
FIG. 2 illustrates a schematic of an operational amplifier circuit.

FIG. 2 illustrates a schematic of an operational amplifier circuit. The schematic of the operational amplifier circuit includes a pair of NMOS transistors M1 and M2, a pair of PMOS transistors M3 and M4, a PMOS transistor M5, current source transistors M6, M7, and M8, a resistor R0, and a capacitor C0. The schematic further includes input ports INP and INN, an output port OUT, a power port VDD, and a ground port VSS. The following user-specified placement constraints are placed on the schematic of FIG. 2:

A free-form grouping constraint is placed on devices R0 and C0.
A mirror-symmetry constraint is placed on devices M1 and M2.
A compound constraint is placed on devices M3 and M4.
A matching constraint is placed on devices M6, M7, and M8.

Figure 3:
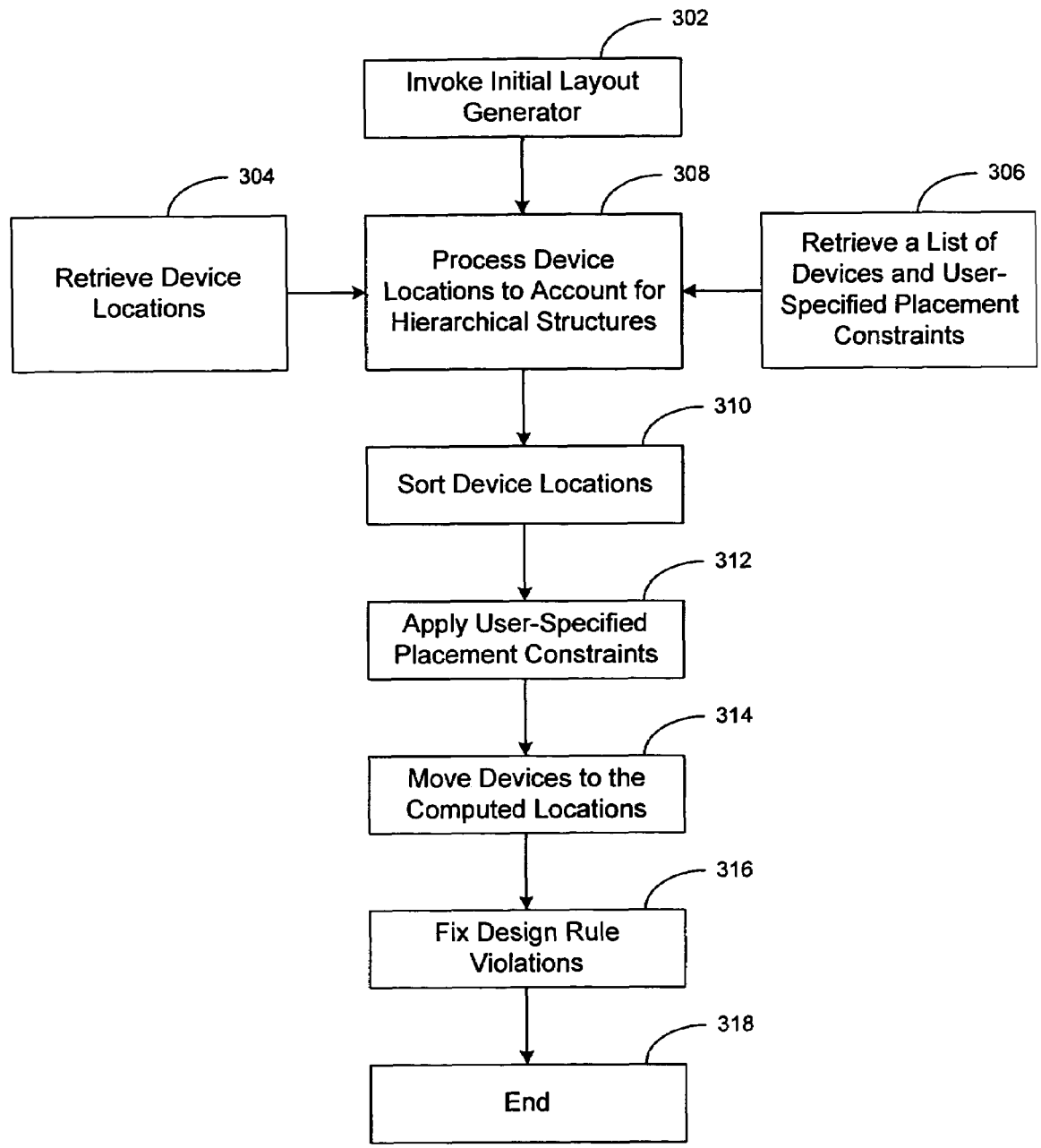
FIG. 3 illustrates a method for generating an initial layout of an integrated circuit according to an embodiment of the present invention.

FIG. 3 illustrates a method for generating an initial layout of an integrated circuit according to an embodiment of the present invention. The method starts in step 302 where the initial layout generator is invoked.

In step 304, the method retrieves a set of locations of a plurality of devices of the integrated circuit created by an Elaborator (not shown). Note that an Elaborator is a tool that can generate location information of the devices in a schematic, in addition to its other functions. The location information of the devices is provided in a form that can be read by the initial layout generator.

In step 306, the method retrieves a list of devices and user-specified placement constraints of the schematic derived from a placement tool (not shown), such as the NeoCell placer tool developed by NeoLinear Inc. The placement tool stores information of various device and user-specified placement constraints. It also stores information of the devices within each group.

In step 308, the method processes device locations to account for any hierarchical structure of the integrated circuit. A hierarchical structure of an integrated circuit exists when the integrated circuit contains one or more instances that are repeatedly used throughout the design. Note that an instance is a portion of a larger design. The initial layout generator goes into each instance, determines the locations of devices within the instance, and translates the locations of devices within each instance to a next upper level of the hierarchical structure.

In step 310, the device locations are sorted according to their horizontal (X) and vertical (Y) locations in the schematic. The ordering of the devices is followed when placing devices in the layout. Once the values for the locations are obtained, the method generates an initial layout by mapping the device locations in the schematic to the corresponding locations in the layout.

In step 312, the method applies user-specified placement constraints to determine the location of each device in the layout created in step 310. The user-specified placement constraints include grouping, symmetry, compound, and matching constraints. Next, the devices are first moved in the X-direction to reflect their locations in the schematic and then in the Y-direction. A person of ordinary skill in the art would recognize that the devices may be moved first in the Y-direction and then in the X-direction, or in other orders of movement. While either of these moves is performed, the user-specified placement constraints are applied. However, if moving a device will violate a design rule, then the device will not be moved.

After applying user-specified placement constraints, in step 314, the method moves the devices to the computed locations. First, this is done for all the devices in a group. Then the average location of the group is calculated (according to the locations of the individual devices in the group) and moved. Since a group can contain sub-groups, the method starts from the lowest sub-group in the hierarchy and works its way up in a bottom-up manner. At each level, the method computes the average location for each group at that level. This step is repeated until all levels of the hierarchy are processed.

In step 316, the method fixes any design rule violations created in previous steps. This is done by using a design-rule-check (DRC) tool to ensure the layout satisfies all design rules. Note that the most important consideration for generating the initial layout is the design rules. Thus, the initial layout generator attempts to satisfy the design rules while honoring user-specified placement constraints and emulating the schematic as closely as possible. Since meeting design rules and user-specified placement constraints takes priority over emulating the schematic, the initial layout generator may not place the devices in the same corresponding locations as in the schematic. In this step, the method may adjust one or more locations of the devices to correct a design rule violation. The corrected locations of devices are stored in databases of the computer system described in FIG. 1. In addition, the graphical-user-interfaces (GUIs) are also updated with the corrected locations of the devices, which are displayed to the user. The method ends in step 318.

Figure 4:
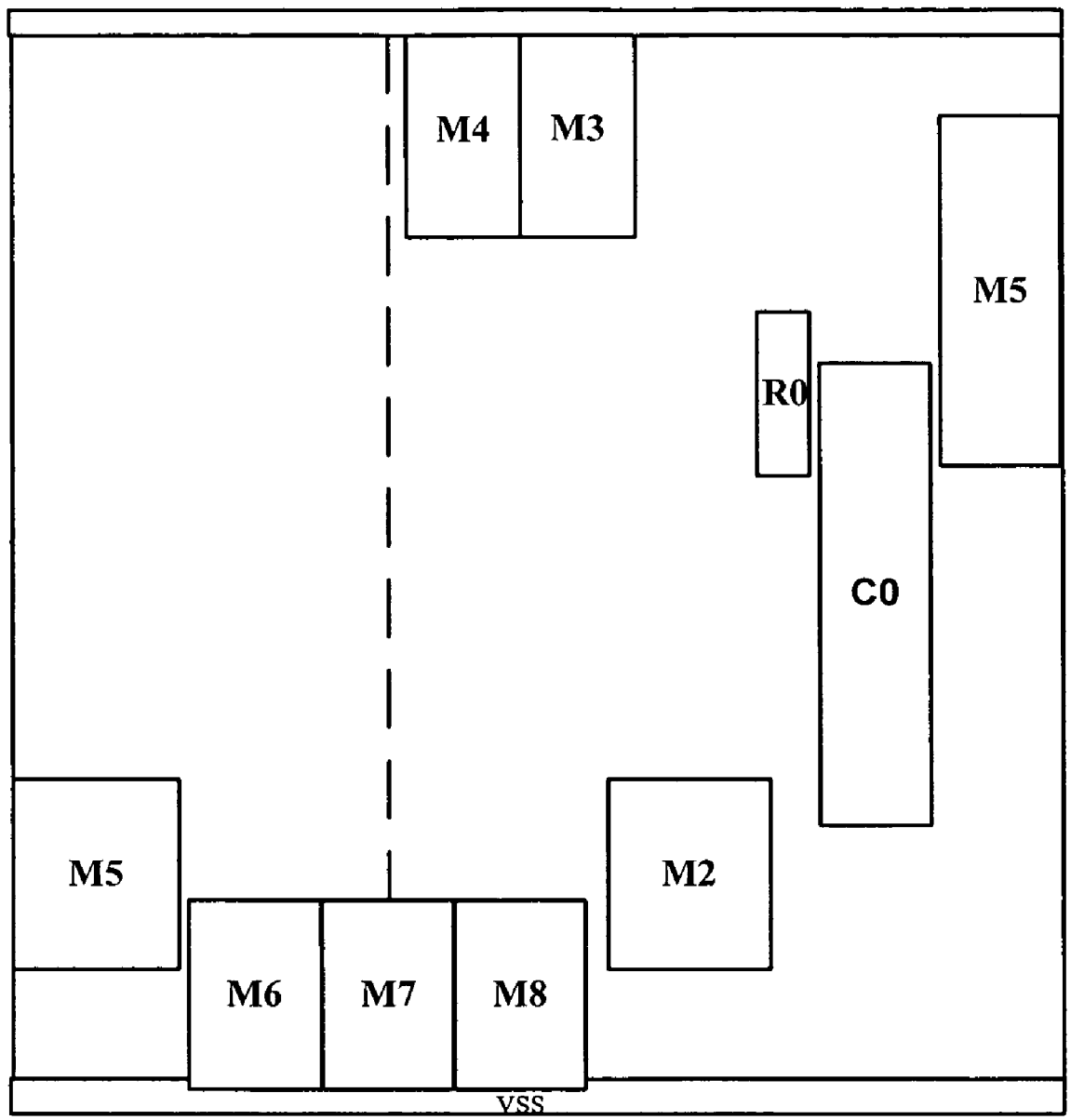
FIG. 4 illustrates an initial layout of the operational amplifier circuit of FIG. 2 according to an embodiment of the present invention.

FIG. 4 illustrates an initial layout of the operational amplifier of FIG. 2 according to an embodiment of the present invention. In FIG. 4, devices M6, M7, and M8 are placed close to each other at the bottom of the layout, similar to their locations at the bottom of the schematic. Because of the matching constraint placed on devices M6, M7, and M8, the devices M6, M7, and M8 become one entity in the initial layout. They cannot be placed at M6, M7, or M8's location. Instead, they are placed at the average location of these three devices. Devices M1 and M2 are placed symmetrically with respect to the dotted symmetric line. Devices M1 and M2 are placed slightly above M6, M7, and M8 so that their locations in the layout resemble their corresponding locations in the schematic. Devices C0 and R0 are placed close to each other in the layout in order to satisfy the grouping constraint. In addition, they are placed slightly above M1 and M2 as in the schematic. The device M5 is placed to the right of R0 and C0, and above the average location of R0 and C0. Devices M3 and M4, which have a compound constraint, are placed at the top of the layout and at the average location of its individual devices.

As shown in FIG. 4, the initial layout generator attempts to provide consistency between the original schematics and the initial layout of the integrated circuit. In this approach, device location consistency is provided by following schematic locations while satisfying the design rules and user-specified placement constraints.

One skilled in the relevant art will recognize that many possible modifications and combinations of the disclosed embodiments may be used, while still employing the same basic underlying mechanisms and methodologies. The foregoing description, for purposes of explanation, has been written with references to specific embodiments. However, the illustrative discussions above are not intended to be exhaustive or to limit the invention to the precise forms disclosed. Many modifications and variations are possible in view of the above teachings. The embodiments were chosen and described to explain the principles of the invention and their practical applications, and to enable others skilled in the art to best utilize the invention and various embodiments with various modifications as are suited to the particular use contemplated.

What is claimed is:

1. A method for generating a layout of an integrated circuit, comprising:
   retrieving locations of a plurality of devices from a schematic of the integrated circuit;
   retrieving user-specified placement constraints; and
   placing the devices in accordance with the locations and the user-specified placement constraints by
   processing device locations to account for a hierarchical structure of the integrated circuit, including traversing each instance in the hierarchical structure, determining locations of devices within each instance, and translating the locations of devices within each instance to a next upper level of the hierarchical structure;
   sorting device locations in accordance with the schematic of the integrated circuit;
   computing locations of devices in accordance with the user-specified placement constraints;
   moving devices to computed locations; and
   fixing design rule violations of the layout.

2. The method of claim 1, wherein the location of each device comprises:
   an x-coordinate for specifying a horizontal location of the device in the layout; and
   a y-coordinate for specifying a vertical location of the device in the layout.

3. The method of claim 1, wherein the user-specified placement constraints comprise:
   grouping constraints for specifying two or more devices to be placed as a group in the layout.

4. The method of claim 3, wherein the grouping constraints further comprise:
   a free-form group constraint for reducing group area.

5. The method of claim 3, wherein the grouping constraints further comprise:
   a grid-form group constraint for interactively placing devices in predefined grid areas.

6. The method of claim 1, wherein the user-specified placement constraints comprise:
   symmetry constraints for specifying one or more devices to be placed symmetrical to each other with respect to a symmetric line in the layout.

7. The method of claim 6, wherein the symmetry constraints further comprise a mirror-symmetry constraint for placing two or more devices as mirror reflection of each other with respect to the symmetric line.

8. The method of claim 6, wherein the symmetry constraints further comprise a simple-symmetry constraint for placing two or more devices at the same distance from the symmetric line.

9. The method of claim 6, wherein the symmetry constraints further comprise a self-symmetry constraint for placing a geometric center of a device along the symmetric line.

10. The method of claim 1, wherein the user-specified placement constraints comprise:
    a compound constraint for specifying two or more devices to be placed as a single entity in the layout.

11. The method of claim 1, wherein the user-specified placement constraints comprise:
    a matching constraint for specifying two or more devices to be placed within close proximity of each other in the layout.

12. The method of claim 1, wherein sorting device locations comprises:
　　sorting locations of devices in accordance with their horizontal locations in the schematic; and
　　sorting locations of devices in accordance with their vertical locations in the schematic.

13. The method of claim 1, wherein computing locations of devices comprises:
　　determining locations of a group of devices in accordance with the user-specified placement constraints; and
　　determining average location for the group of devices.

14. The method of claim 1, wherein moving devices to computed locations comprises:
　　traversing the hierarchical structure; and
　　moving devices in a bottom up manner.

15. The method of claim 1, wherein fixing design rule violations comprises:
　　applying a design-rule-check (DRC) tool on the layout;
　　adjusting locations of devices to correct design rule violations;
　　updating databases with corrected locations of devices; and
　　updating graphical user interfaces (GUIs) with corrected locations of devices.

16. A computer program product, comprising a medium storing programs for execution by one or more computer systems, die computer program product comprising:
　　a layout generator module for generating a layout of an integrated circuit, wherein the layout generator module is used in conjunction with at least a microprocessor unit, a memory, and a user interface, and wherein the layout generator module includes one or more computer programs comprising instructions for:
　　retrieving locations of a plurality of devices from a schematic of the integrated circuit;
　　retrieving user-specified placement constraints; and
　　placing the devices in accordance with the locations and the user-specified placement constraints by
　　processing device locations to account for a hierarchical structure of the integrated circuit, including traversing each instance in the hierarchical structure, determining locations of devices within each instance, and translating the locations of devices within each instance to a next upper level of the hierarchical structure;
　　sorting device locations in accordance with the schematic of the integrated circuit;
　　computing locations of devices in accordance with the user-specified placement constraints;
　　moving devices to computed locations; and
　　fixing design rule violations of the layout.

17. The computer program product of claim 16, wherein the location of each device comprises:
　　an x-coordinate for specifying a horizontal location of the device in the layout; and
　　a y-coordinate for specifying a vertical location of the device in the layout.

18. The computer program product of claim 16, wherein the user-specified placement constraints comprise:
　　grouping constraints for specifying two or more devices to be placed as a group in the layout.

19. The computer program product of claim 18, wherein the grouping constraints further comprise:
　　a free-form group constraint for reducing group area.

20. The computer program product of claim 18, wherein the grouping constraints further comprise:
　　a grip-form group constraint for interactively placing devices in predefined grip areas.

21. The computer program product of claim 16, wherein the user-specified placement constraints comprise:
　　symmetry constraints for specifying one or more devices to be placed symmetrical to each other with respect to a symmetric line in the layout.

22. The computer program product of claim 21, wherein the symmetry constraints further comprise a mirror-symmetry constraint for placing two or more devices as mirror reflection of each other with respect to the symmetric line.

23. The computer program product of claim 21, wherein the symmetry constraints further comprise a simple-symmetry constraint for placing two or more devices at a same distance from the symmetric line.

24. The computer program product of claim 21, wherein the symmetry constraints further comprise a self-symmetry constraint for placing a geometric center of a device along the symmetric line.

25. The computer program product of claim 16, wherein the user-specified placement constraints comprise:
　　a compound constraint for specifying two or more devices to be placed as a single entity in the layout.

26. The computer program product of claim 16, wherein the user-specified placement constraints comprise:
　　a matching constraint for specifying two or more devices to be placed within close proximity of each other in the layout.

27. The computer program product of claim 16, wherein the instructions for sorting device locations comprise instructions for:
　　sorting locations of devices in accordance with their horizontal locations in the schematic; and
　　sorting locations of devices in accordance with their vertical locations in the schematic.

28. The computer program product of claim 16, wherein the instructions for computing locations of devices comprise instructions for:
　　determining locations of a group of devices in accordance wit the user-specified placement constraints; and
　　determining average location for the group of devices.

29. The computer program product of claim 16, wherein the instructions for moving devices to computed locations comprise instructions for:
　　traversing the hierarchical structure; and
　　moving devices in a bottom up manner.

30. The computer program product of claim 16, wherein the instructions for fixing design rule violations comprise instructions for:
　　applying a design-rule-check (DRC) tool on the layout;
　　adjusting locations of devices to correct design rule violations;
　　updating databases with corrected locations of devices; and
　　updating graphical user interfaces (GUIs) with corrected locations of devices.

31. A system for generating a layout of an integrated circuit, comprising:
　　at least one processing unit for executing computer programs;
　　a graphical-user-interface for viewing representations of the integrated circuit on a display and observing the layout of the integrated circuit;
　　a memory for storing databases of the integrated circuit;
　　means for retrieving locations of a plurality of devices from a schematic of the integrated circuit;
　　means for retrieving user-specified placement constraints; and means for placing the devices in accordance with the locations and the user-specified placement constraints, wherein the means for placing the devices comprises:

means for processing device locations to account for a hierarchical structure of the integrated circuit, including means for traversing each instance in the hierarchical structure, means for determining locations of devices within each instance, and means for translating the locations of devices within each instance to a next upper level of the hierarchical structure;

means for sorting device locations in accordance with the schematic of the integrated circuit;

means for computing locations of devices in accordance with the user-specified placement constraints;

means for moving devices to computed locations; and means for fixing design rule violations of the layout.

32. The system of claim 31, wherein the location of each device comprises:

an x-coordinate for specifying a horizontal location of the device in the layout; and a y-coordinate for specifying a vertical location of the device in the layout.

33. The system of claim 31, wherein the user-specified placement constraints comprise:

grouping constraints for specifying two or more devices to be placed as a group in the layout.

34. The system of claim 33, wherein the grouping constraints further comprise:

a free-form group constraint for reducing group area.

35. The system of claim 33, wherein the grouping constraints further comprise:

a grip-form group constraint for interactively placing devices in predefined grip areas.

36. The system of claim 31, wherein the user-specified placement constraints comprise:

symmetry constraints for specifying one or more devices to be placed symmetrical to each other with respect to a symmetric line in the layout.

37. The system of claim 36, wherein the symmetry constraints further comprise a mirror-symmetry constraint for placing two or more devices as mirror reflection of each other with respect to the symmetric line.

38. The system of claim 36, wherein the symmetry constraints further comprise a simple-symmetry constraint for placing two or more devices at the same distance from the symmetric line.

39. The system of claim 36, wherein the symmetry constraints further comprise a self-symmetry constraint for placing a geometric center of a device along the symmetric line.

40. The system of claim 31, wherein the user-specified placement constraints comprise:

a compound constraint for specifying two or more devices to be placed as a single entity in the layout.

41. The system of claim 31, wherein the user-specified placement constraints comprise:

a matching constraint for specifying two or more devices to be placed within close proximity of each other in the layout.

42. The system of claim 31, wherein the means for sorting device locations comprise:

means for sorting locations of devices in accordance with their horizontal locations in the schematic; and means for sorting locations of devices in accordance with their vertical locations in the schematic.

43. The system of claim 31, wherein the means for computing locations of devices comprise:

means for determining locations of a group of devices in accordance with the user-specified placement constraints; and means for determining average location for the group of devices.

44. The system of claim 31, wherein the means for moving devices to computed locations comprise:

means for traversing the hierarchical structure; and means for moving devices in a bottom up manner.

45. The system of claim 31, wherein the means for fixing design rule violations comprise:

means for applying a design-rule-check (DRC) tool on the layout;

means for adjusting locations of devices to correct design rule violations;

means for updating databases with corrected locations of devices; and means for updating graphical user interfaces (GUIs) with corrected locations of devices.

* * * * *